United States Patent
Schlepple et al.

(10) Patent No.: US 12,237,643 B2
(45) Date of Patent: Feb. 25, 2025

(54) HEATSINKING IN LASER DEVICES

(71) Applicant: Cisco Technology, Inc., San Jose, CA (US)

(72) Inventors: Norbert Schlepple, Macungie, PA (US); Jock T. Bovington, La Mesa, CA (US); Mary Nadeau, Alburtis, PA (US); Mittu Pannala, Breinigsville, PA (US); Jarrett S. Neiman, Coopersburg, PA (US)

(73) Assignee: Cisco Technology, Inc., San Jose, CA (US)

( * ) Notice: Subject to any disclaimer, the term of this patent is extended or adjusted under 35 U.S.C. 154(b) by 870 days.

(21) Appl. No.: 17/302,964

(22) Filed: May 17, 2021

(65) Prior Publication Data

US 2022/0368102 A1 Nov. 17, 2022

(51) Int. Cl.
*H01S 5/024* (2006.01)
*H01S 5/02* (2006.01)
*H01S 5/02326* (2021.01)

(52) U.S. Cl.
CPC ........ *H01S 5/02476* (2013.01); *H01S 5/0215* (2013.01); *H01S 5/02326* (2021.01); *H01S 5/02438* (2013.01)

(58) Field of Classification Search
CPC ............ H01S 5/02476; H01S 5/06243; H01S 5/02252
USPC .......................................................... 372/36
See application file for complete search history.

(56) References Cited

U.S. PATENT DOCUMENTS

| | | | |
|---|---|---|---|
| 2005/0089070 A1* | 4/2005 | Honda | H01S 5/02212 372/36 |
| 2008/0013576 A1 | 1/2008 | Honda | |
| 2014/0147127 A1 | 5/2014 | McColloch et al. | |
| 2014/0322840 A1 | 10/2014 | Bean et al. | |
| 2015/0131687 A1 | 5/2015 | Oh et al. | |
| 2017/0093122 A1* | 3/2017 | Bean | H01S 5/0225 |

(Continued)

FOREIGN PATENT DOCUMENTS

JP S5988886 A 5/1984

OTHER PUBLICATIONS

PCT, Notification of Transmittal of the International Search Report and the Written Opinion of the International Searching Authority, or the Declaration of Application PCT/US2022/072290 dated Sep. 15, 2022.

*Primary Examiner* — Tuan N Nguyen
(74) *Attorney, Agent, or Firm* — Patterson + Sheridan, LLP

(57) ABSTRACT

Heatsinking in laser devices may be improved via a device, including: a header disk having a first face with a circumference; a header post that is thermally conductive, and having: a second face connected to the first face coterminously with the circumference; a third face opposite to the second face; and a fourth face perpendicular to the second face and the third face; a lens holder, having a fifth face connected to the third face; and an optical subassembly connected to the fourth face and optically aligned with the lens holder. The device may also be understood to comprise: a header disk having a circumference; a header post that is thermally conductive, the header post having: an arc coterminous to a portion of the circumference; a mounting face, perpendicular to a plane in which the arc and the circumference are defined; and a bonding face perpendicular to the mounting face.

20 Claims, 9 Drawing Sheets

(56) References Cited

U.S. PATENT DOCUMENTS

| | | |
|---|---|---|
| 2018/0019569 A1 | 1/2018 | Law et al. |
| 2019/0140420 A1* | 5/2019 | Huang ................ H01S 5/02375 |
| 2020/0067268 A1 | 2/2020 | Kunitomo et al. |

* cited by examiner

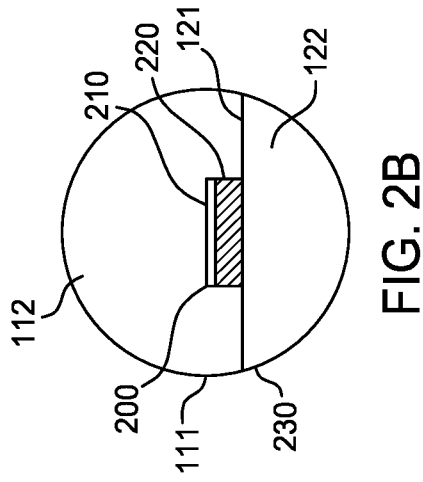
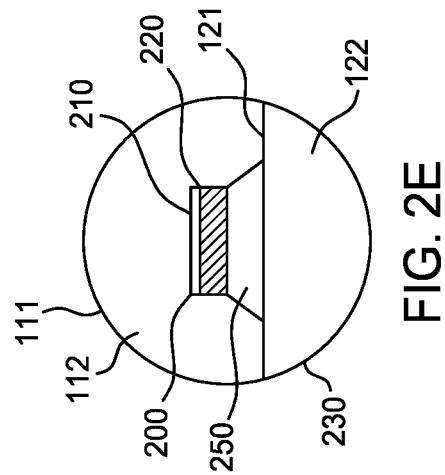
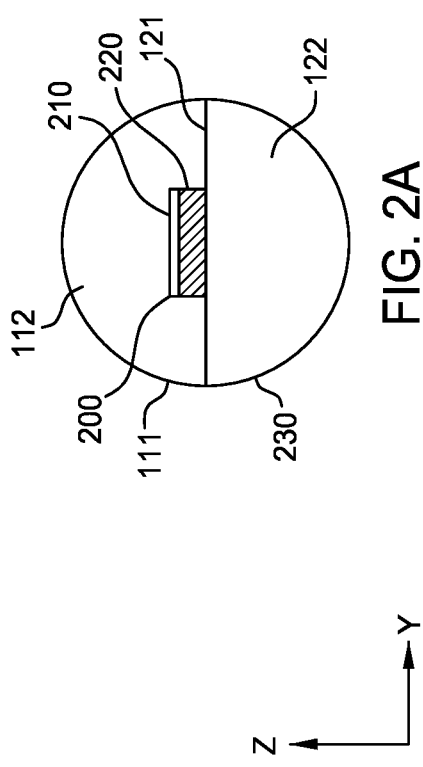
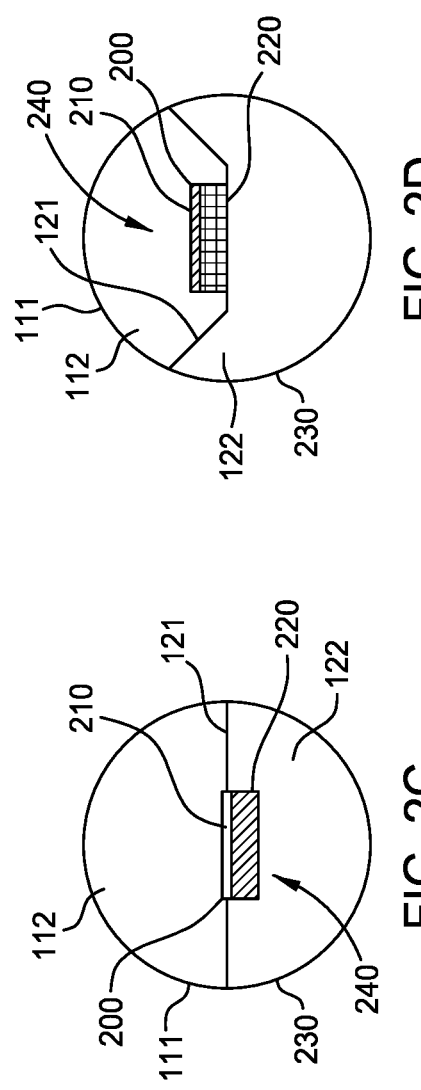

HEATSINKING IN LASER DEVICES

TECHNICAL FIELD

Embodiments presented in this disclosure generally relate to heatsinks in laser devices. More specifically, embodiments disclosed herein provide for novel heatsinking structures for use with Transistor Outline (TO) can structures.

BACKGROUND

Silicon Photonics platforms often use an external light source to generate an optical signal. In some embodiments, the external light source is a Continuous Wave (CW) laser that transmits a CW optical signal that is modulated internally by the photonic platform. The CW lasers operate with an order of magnitude more power than DM lasers, and thus produce more heat.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

FIGS. 2A-2E illustrate various arrangements of an optical subassembly bonded with a header structure, according to embodiments of the present disclosure.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

One embodiment presented in this disclosure is a device, including: a header disk having a first face with a circumference; a header post that is thermally conductive, the header post having: a second face connected to the first face coterminously with the circumference; a third face opposite to the second face; and a fourth face perpendicular to the second face and the third face; a lens holder, having a fifth face connected to the third face; and an optical subassembly connected to the fourth face and optically aligned with the lens holder.

One embodiment presented in this disclosure is a device, comprising: a header disk having a circumference; a header post that is thermally conductive, the header post having: an arc coterminous to a portion of the circumference; a mounting face, perpendicular to a plane in which the arc and the circumference are defined; and a bonding face perpendicular to the mounting face.

One embodiment presented in this disclosure is a method for constructing a transmitter optical subassembly (TOSA), comprising: bonding a first face of a header disk to a second face of a header post that is thermally conductive, wherein an arc described by a third face of the header post is aligned with a circumference described by a fourth face of the header disk; bonding a fifth face of a lens holder to a sixth face of the header post, opposite to the second face; and bonding a laser sub-mount to a seventh face of the header post, perpendicular to the second face and the sixth face.

Example Embodiments

Existing architectures for coupling a light source to an optical fiber (for transmission to the photonic platform) are generally inefficient at directing heat out or away from the device (e.g., to a heatsink), but these thermal inefficiencies can be ignored if the light source is a low power device. However, as higher power light sources are deployed, greater thermal efficiency is desirable. The present disclosure provides novel heatsinking structures for use with TO-CAN structures. The heatsinking structures discussed herein have larger, and more direct, heat paths than previous heatsinking structures. By establishing more direct contact between the laser and an external element (rather than sealing the header post along with the laser by a cover or other case), the present disclosure provides for improved heat sinking and easier bonding with an external heatsink.

Figure 1A:
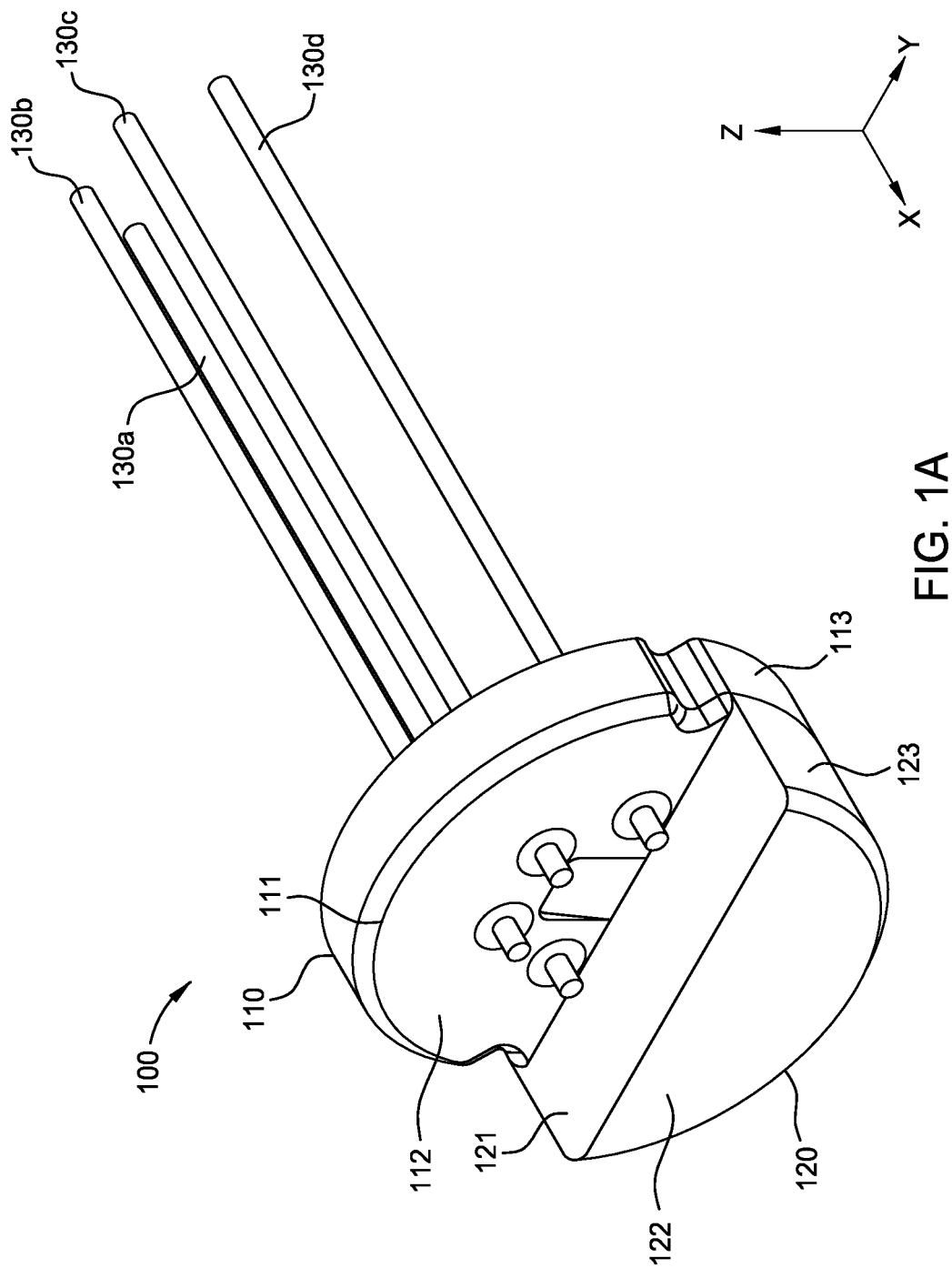
FIGS. 1A and 1B illustrate isometric views of the header structure, according to embodiments of the present disclosure.
Figure 1B:
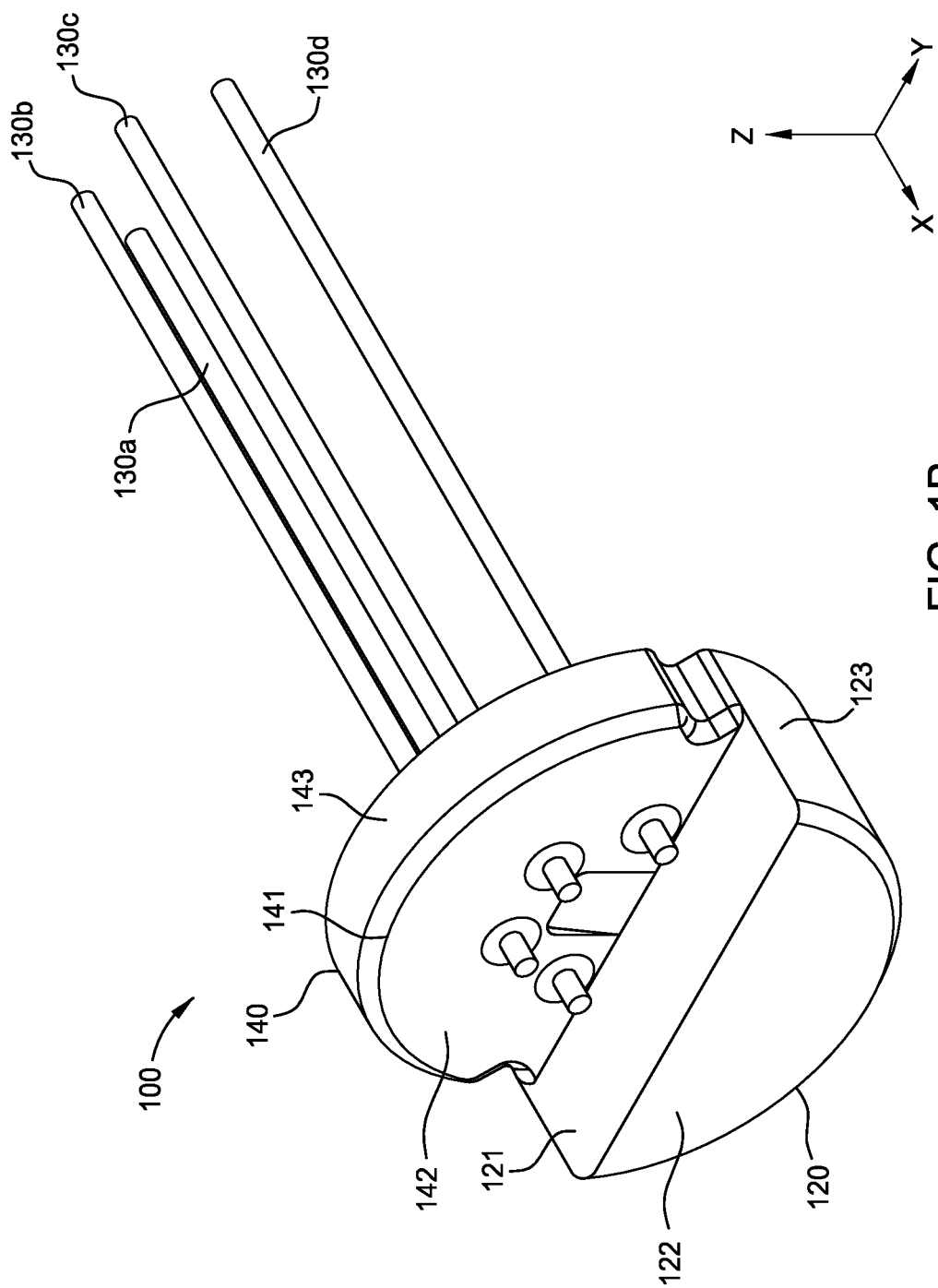

FIGS. 1A and 1B illustrate an isometric views of the header structure 100, according to embodiments of the present disclosure.

In FIG. 1A, the header structure 100 includes a header disk 110, a header post 120, and one or more electrical leads 130a-d (generally or collectively, leads 130). The header disk 110 includes an internal face 112 that is generally or substantially circular in cross-section, having a circumference 111 defined by a radius R. A radial face 113 orbits the internal face 112 according to the radius R. Although described as generally circular, the present disclosure contemplates that alignment features (e.g., notches, flattened sections) and the manufacturing tolerances can affect the overall "roundness" of the header disk 110, without affecting the overall generally circular nature of the header disk 110. The header disk 110 includes one or more through holes to pass the leads 130 through from one side to the internal face 112, and to secure those leads 130 in place.

In FIG. 1B, the header structure 100 includes a header lip 140, a header post 120, and one or more electrical leads 130a-d. The header lip 140 includes an internal face 142 that is generally or substantially semi-circular, having an arc 141 defined by a radius R. A radial face 143 orbits the internal face 142 according to the radius R. Although described as generally semi-circular, the present disclosure contemplates that alignment features (e.g., notches, flattened sections) and the manufacturing tolerances can affect the overall "roundness" of the header lip 140, without affecting the overall generally circular nature of the header disk 110. The header lip 140 includes one or more through holes to pass the leads 130 through from one side to the internal face 142, and to secure those leads 130 in place The header post 120 is a thermally conductive component either separately constructed from and later bonded to the header disk 110 or header lip 140 (e.g., via a weld joint) or constructed as one piece with the header disk 110. The header post 120 includes a mounting face 121, a bonding face 122, and an arced face 123. In FIG. 1A, the header post 120 includes a connecting face (not illustrated, opposite to the bonding face 122) used to connect the header post 120 and the header disk 110. In FIG. 1B, the header lip 140 includes a connecting face (not illustrated, perpendicular to the internal face 142) used to connect the header lip 140 to the mounting face 121 of the header post 120. The mounting face 121 is at least partially perpendicular to the bonding face 122 (and the internal face 112 and/or the connecting face). The arced face 123 shares the radius R with the circumference 111 of the header disk 110 or the arc 141 of the header lip 140 so that the arced face 123 is coterminous with the radial face 113/143.

The mounting face 121 is provided to allow an optical component to mount to the header post 120 (e.g., via soldering, brazing, welding, wire mounts, adhesives, or pressure/friction mounting). In various embodiments, the header post 120 is made of Copper (Cu), Stainless Steel, a Copper Tungsten (CuW) alloy, of various alloys including Cu and/or Tungsten (W) to allow for thermal conduction from the mounting face 121 to the arced face 123. Several different potential arrangements of the mounting face 122 and the arced face 123 are shown in greater detail in regard to FIGS. 2A-2E. In various embodiments, the arced face 123 is connected to an external heatsink, while in other embodiments, the surface of the arced face 123 acts as a heatsink to dissipate heat received from the optical component to the surrounding environment.

The electrical leads 130 provide electrical connections to the optical component, which can include power for the optical component, electrical signals (to convert to optical signals), and feedback signals from the optical component to a controller. Although shown in FIGS. 1A and 1B with four electrical leads 130a-d, in various embodiments, more or fewer than four leads 130 can be used. Additionally, the leads 130 can include various wires (with or without electrical insulation on various sections) and defined electrical traces, power/signal conduits, and various other non-wire conductors.

FIGS. 2A-2E illustrate various arrangements of an optical subassembly 200 bonded with a header structure 100, according to embodiments of the present disclosure. In some embodiments, the optical subassembly 200 includes an optical device 210, such as a laser diode or other light source, and a sub-mount 220 that includes various electrical components to control how and when the optical device 210 generates light based on input electrical signals. In some embodiments, the optical subassembly 200 includes an optical device 210, such as a photodiode or other light detector, and the sub-mount 220 includes various electrical components to convert light received by the optical device 210 into output electrical signals. In various embodiments, the optical device 210 receives an optical signal from an external light source, such as a direct modulated (DM) laser that transmits a pre-modulated optical signal to the optical subassembly 200 to perform various optical functions on the signal, including: dispersion compensation, wavelength multiplexing, attenuation, or the like.

The arc 230 described by the arced face 123 shares a radius R with the circumferences 111 of the header disk 110, but can describe various segment lengths less than, equal to, or greater than 180 degrees in various embodiments. In various embodiments, the bonding face 122 is semi-circular (as in FIGS. 2A and 2C) or lunate (e.g., crescent shaped, as in FIGS. 2B and 2D) to define whether the sub-mount 220 mounted to the mounting face 121 is aligned with the center of the header structure 100 in one or more axes (e.g., on the Y axis for FIGS. 2A and 2D, on the Y and Z axes for FIGS. 2B and 2C).

In various embodiments, the sub-mount 220 can be positioned flush with the mounting face 121 (as in FIGS. 2A and 2B) or offset from the mounting face 121 and may be disposed in a cavity 240 defined in the mounting face 121 (as in FIGS. 2C and 2D) or above the mounting face 121 on an elevated portion level with the desired height of the laser sub-mount 220, such as platform 250 (as in FIG. 2E).

Additionally or alternatively, in some embodiments, the cross-sectional shape of the header post 120 can vary over the course of the header post 120. For example, the arc 230 can describe less than 180 degrees in a first cross-section and more than 180 degrees in a second cross-section. Similarly, the optical subassembly 200 can vary in size and position in different cross-sectional views (e.g., having a peg or other projection to fit into a slot defined in the header post 120). Accordingly, each of the views shown in FIGS. 2A-2E may be of different header posts 120 and optical subassemblies 200 or of different cross-sections of one header post 120 and optical subassembly 200.

Figure 3:
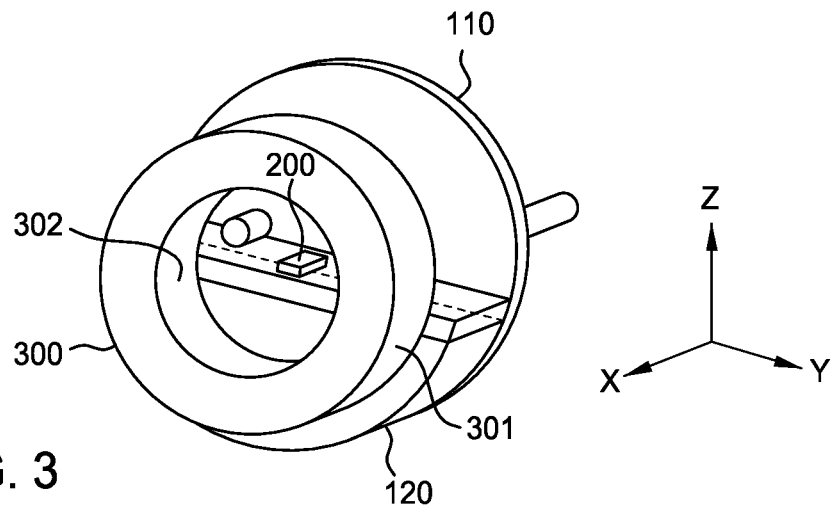
FIG. 3 illustrates an isometric view of the header structure bonded with a lens holder, according to embodiments of the present disclosure.

FIG. 3 illustrates an isometric view of the header structure 100 bonded with a lens holder 300, according to embodiments of the present disclosure. The lens holder 300 (when assembled) includes a lens (not illustrated in FIG. 3) in place to focus light generated by the optical subassembly 200 for transmission onto an optical fiber (not illustrated in FIG. 3) or to focus light received from an optical fiber for reception by the optical subassembly 200.

The lens holder 300 is shown in FIG. 3 as an annular cylinder with a generally circular outer surface 301 and a generally circular inner surface 302, but other shapes besides circles can be used in various embodiments for one or both of the outer surface 301 and the inner surface 302. Additionally, various alignment features on the outer surface 301 and the inner surface 302 (e.g., for capturing a lens in place) can be included without affecting the overall generally annular nature of the lens holder 300.

The lens holder 300 is bonded to the bonding face 122 of the header post 120. In various embodiments, the outer surface 301 of the lens holder 300 can be coterminous with the arced face 123 of the header post 120. In other embodiments, as shown in FIG. 3, the outer surface 301 of the lens holder 300 can be offset from the arced face 123 of the header post 120. As shown in FIG. 3, the lens holder 300 is concentrically aligned with the header disk 110, however, in various embodiments, the lens holder 300 may be aligned with an offset on one or more axes from the header disk 110.

Figure 4A:
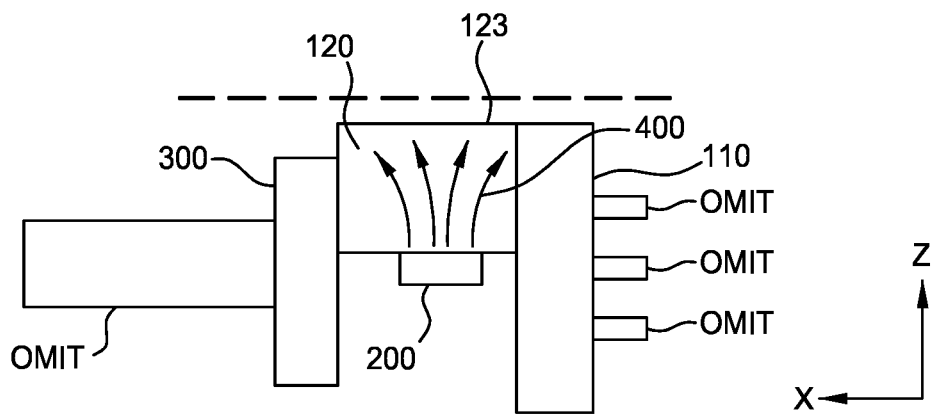
FIG. 4A illustrates a first cross-sectional view of the heat paths offered by the header structure, according to embodiments of the present disclosure.
Figure 4B:
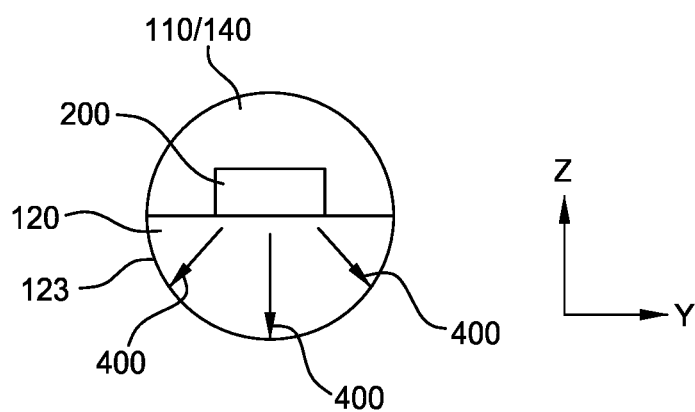
FIG. 4B illustrates a second cross-sectional view of the heat paths offered by the header structure, according to embodiments of the present disclosure.

FIGS. 4A and 4B illustrate cross-sectional views of the header structure 100 in different planes to show heat paths 400, according to embodiments of the present disclosure. FIG. 4A illustrates a cross-section in the XZ plane, while FIG. 4B illustrates a cross-section in the YZ plane.

Because the header post 120 is made of a thermally conductive material, and is of the same radius as the header disk 110, the arced face 123 is an external surface of the fully assembled TO-CAN structure. Therefore, the thermally conductive material of the header post 120 located between the optical subassembly 200 and the external environment (or an attached external heatsink) provides direct heat paths 400 for dissipating heat from the optical subassembly 200. Stated differently, the heat paths 400 do not have to travel through the header disk 110 to dissipate heat from the optical subassembly 200, and are provided with the comparatively larger surface area of the arced face 123 to transfer heat through to the external environment or an external heatsink. Accordingly, the present disclosure provides for improved heatsinking within the same size and shape constraints of TO-CAN or Transmitter Optical Subassembly (TOSA) assemblies that use a header post that is hermetically sealed away from the external environment.

Figure 5A:
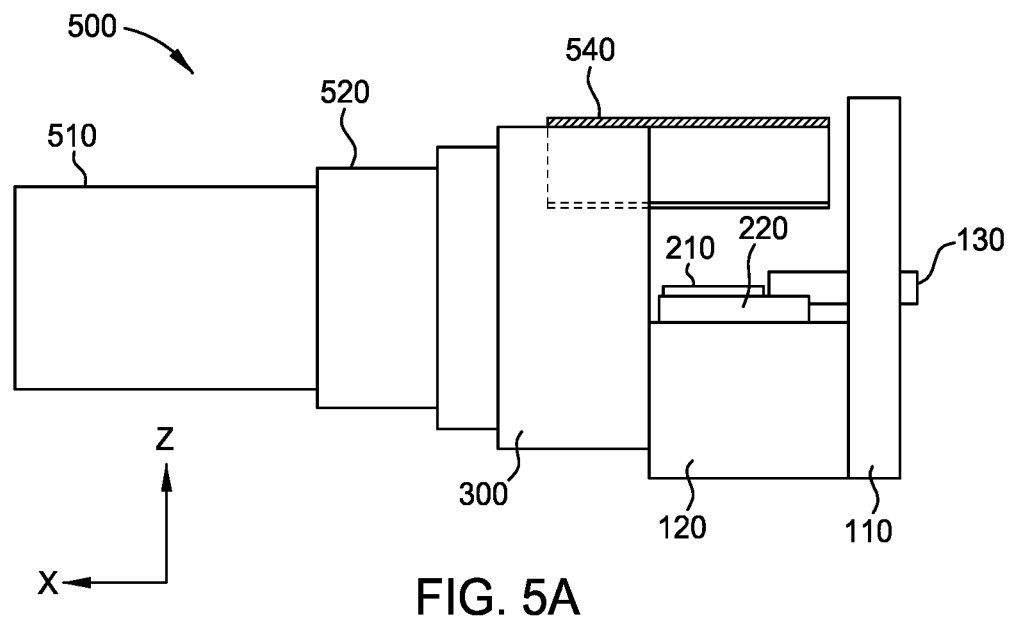
FIGS. 5A-5D illustrate side-views of an assembled structure, according to embodiments of the present disclosure.
Figure 5B:
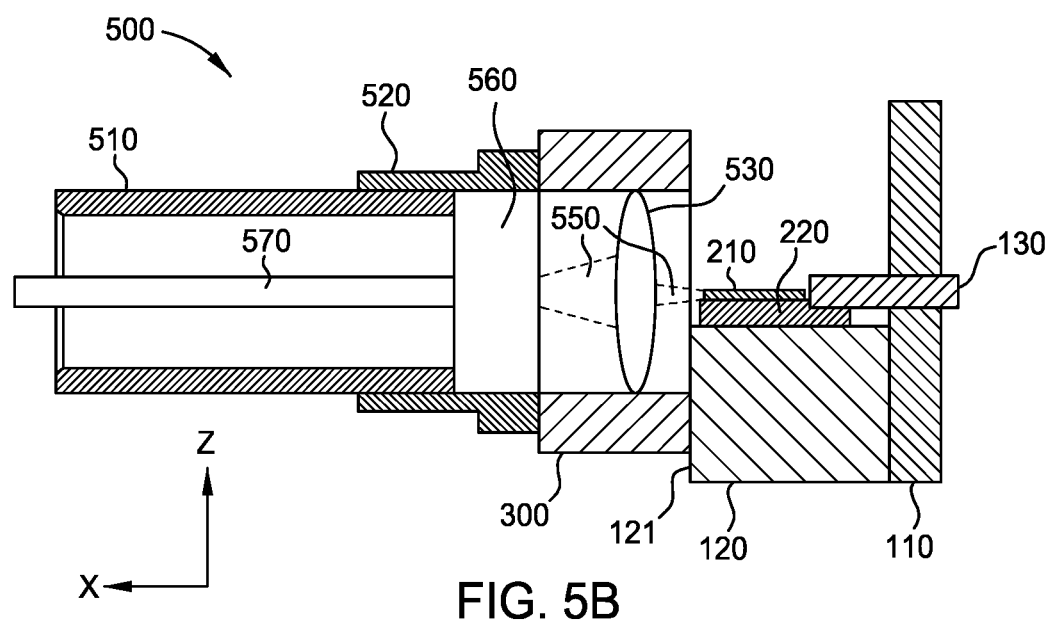
Figure 5C:
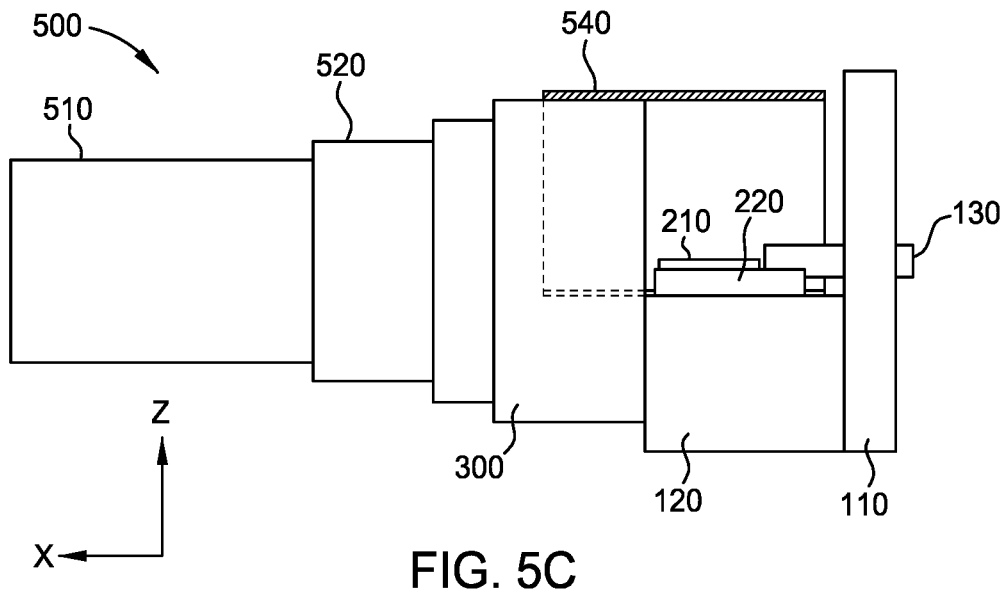
Figure 5D:
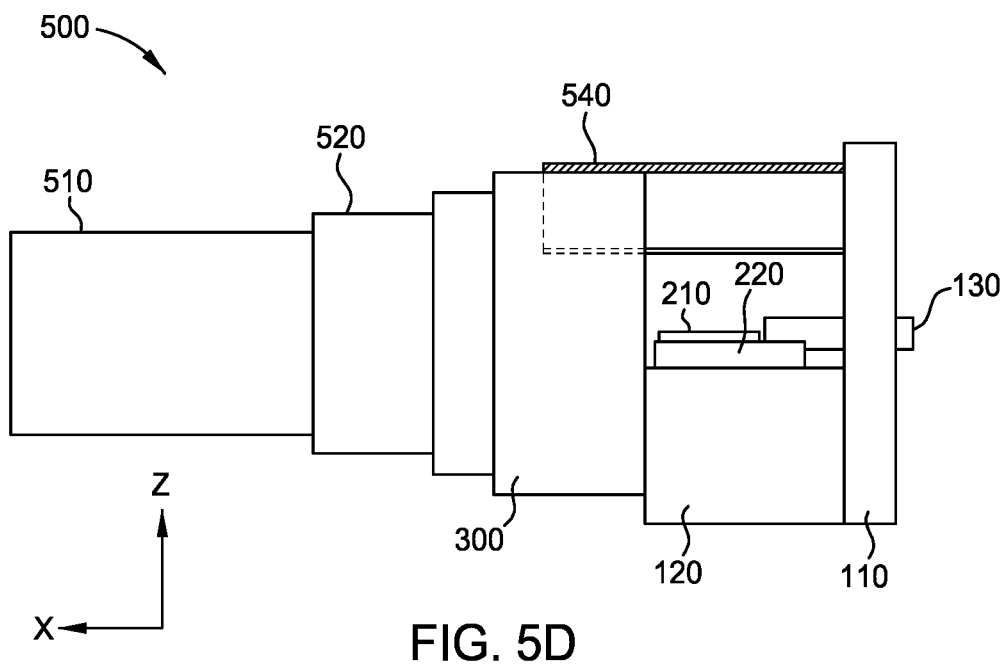

FIGS. 5A-5D illustrate side-views of an assembled TO-CAN structure 500, with FIGS. 5A, 5C, and 5D illustrating external views while FIG. 5B illustrates a cross-sectional side-view of the assembled TO-CAN structure 500, according to embodiments of the present disclosure. As assembled TO-CAN structure 500 includes the header disk 110, the header post 120, one or more leads 130, the optical device 210, the sub-mount 220, and the lens holder 300 as described in FIGS. 1, 2A-2E, and 3.

A fiber receptacle 510 is connected to the lens holder 300 via a z-sleeve 520 bonded with the lens holder 300. The z-sleeve 520 provides for alignment freedom when attaching the fiber receptacle to the lens holder 300. The fiber receptacle 510, in turn, includes an optical fiber 570 that the fiber receptacle 510 protects from the environment. In various embodiments, the optical fiber 570 is designed to carry light generated by the optical device 210 to another device or optical fiber (e.g., for optical signal processing, multiplexing, de-multiplexing, etc.) or to carry light from an external device to the optical device 210. The fiber receptacle 510 or the fiber 570 can include insulation and protective coatings, and the optical fiber 570 can include one or more cores for carrying optical signals.

The fiber receptacle 510 and the z-sleeve 520 hold the optical fiber 570 in place relative to the lens 530 held by the lens holder 300. In turn, the optical fiber 570 is positioned relative to the lens 530 and the optical device 210 so that the lens 530 can focus incoming or outgoing light between the optical fiber 570 and the optical device 210, ensuring a beam path 550 is established between the elements. Additionally, the lens 530 can focus the optical signal to have a different size or mode at each of the optical fiber 570 and the optical device 210.

An optical isolator 560, which can include various antireflective coatings and filters tuned for various wavelengths, is included in the beam path 550. In various embodiments, the optical isolator 560 is a separate component included in the receptacle 510 or a standalone component located elsewhere in the beam path 550.

In some embodiments, an optional cover 540 is included in the TO-CAN structure 500. As shown in FIGS. 5A, 5C, and 5D, the cover 540 can be of various lengths (in the X direction) and can encompass various arcs (in a ZY plane) around the lens holder 300 and/or the header post 120. The cover 540 can be bonded to one or more of the outer surface 301 of the lens holder 300, the header disk 110, and the header post 120 to provide additional protection to the optical subassembly 200. In some embodiments, the cover 540 provides a hermetic seal for a cavity defined by the lens 530, lens holder 300, header disk 110, header post 120, and cover 540, but can provide a non-hermetic seal or no seal (e.g., as a partial covering not defining a cavity) in other embodiments.

Figure 6A:
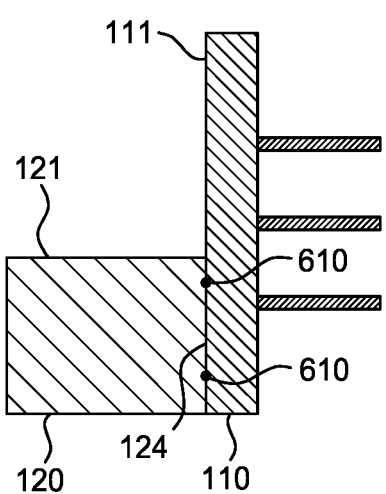
FIG. 6A-6C illustrate assembly of components of a TO-CAN structure, according to embodiments of the present disclosure.
Figure 6B:
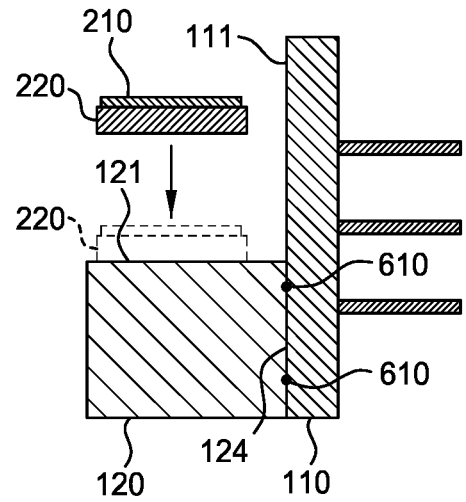
Figure 6C:
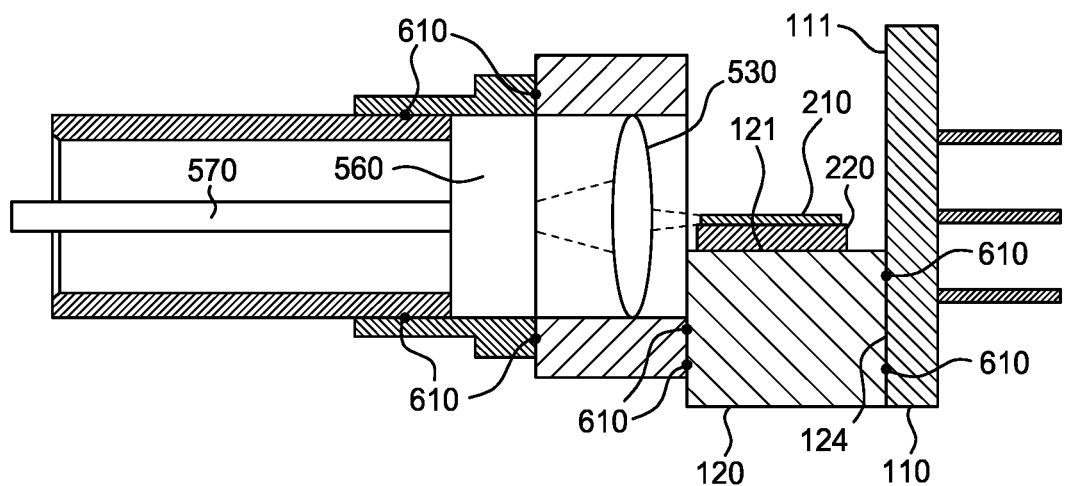

FIG. 6A-6C illustrate assembly of components of a TO-CAN structure 500, according to embodiments of the present disclosure.

FIG. 6A illustrates that the connecting face 124 of the header post 120 is bonded with a portion of the internal face 112 of the header disk 110 to form the header structure 100. In various embodiments, one or more joints 610 are formed at the interfaces of the connecting face 124 and the internal face 112 as performed via laser welding, brazing, welding, soldering, or various adhesives to form the header structure 100. Although two joints 610 are illustrated in FIG. 6A, more or fewer joints 610 can be formed in various embodiments. In various embodiments, the header disk 110 and the header post 120 can instead be formed as a single-piece (e.g., by removing material from a cylinder to define the internal face 112 and the mounting face 121), thus requiring no joints 610 to be formed.

FIG. 6B illustrates that the optical subassembly 200 is placed on the mounting face 121 of the header post 120 in a desired position before bonding. In various embodiments, pick-and-place die-bonding equipment align and secure the optical subassembly 200 to the mounting face 121. Various connections between the leads 130 and the sub-mount 220 can then be formed via soldering, wire-bonding, or the like.

FIG. 6C illustrates a series of joints 610 that can be formed via laser welding, brazing, welding, soldering, or various adhesives to assembly the TO-CAN structure 500. A coaxial welding system can bond the elements together via the joints 610. Although six joints 610 are illustrated in FIG. 6C, more or fewer joints 610 can be formed in various embodiments. For example, when a cover 540 is included, additional joints 610 can be formed between the cover 540 and one or more of the lens holder 300, the header disk 110, and the header post 120.

As illustrated in FIG. 6C, a first joint 610 and a second joint 610 are formed between the bonding face 122 of the header post 120 and the lens holder 300 to hold the lens holder 300 and the header structure 100 together. A third joint 610 and a fourth joint 610 are formed between different elements of the receptacle 510 and the z-sleeve 520 (e.g., between a fiber "pigtail" and a z-sleeve 520) to hold the receptacle 510 and z-sleeve together, while and a fifth joint 610 and a sixth joint 610 formed between the lens holder 300 and the z-sleeve 520 hold the components together.

In various embodiments, the joints 610 are formed as point welds (and additional joints 610 can be formed in planes beyond the plane illustrated in FIG. 6B). In other embodiments, the joints 610 are formed via continuous welds, in which case the third and fourth joints 610 can be formed via a single weld and the fifth and sixth joint 610 can be formed via a (different) single weld (e.g., rotating each weld around the X-axis).

Figure 7:
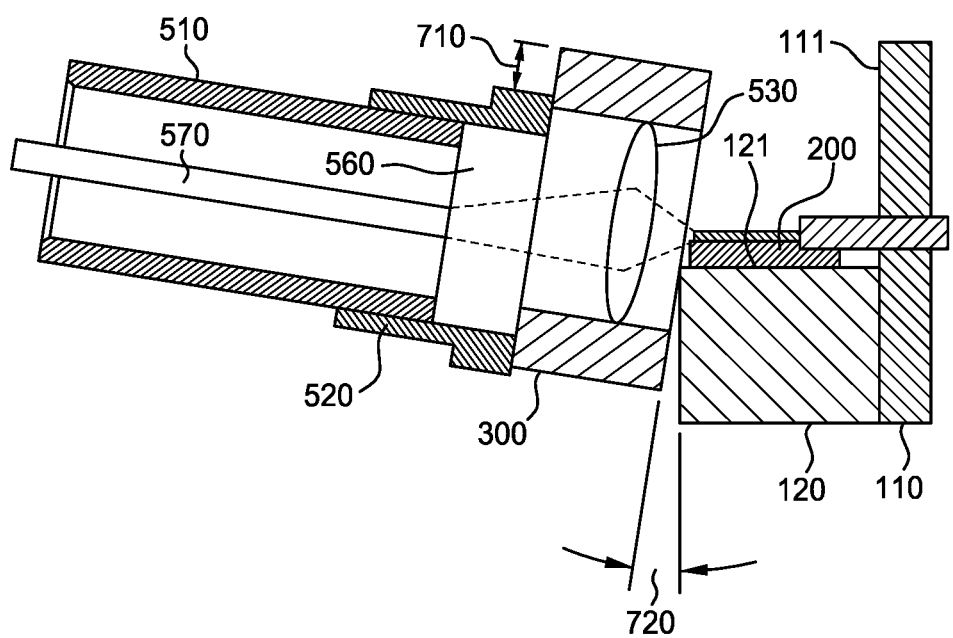
FIG. 7 illustrates component offsetting for assembly, according to embodiments of the present disclosure.

FIG. 7 illustrates component offsetting for assembly, according to embodiments of the present disclosure. To counteract potential shift or tilt during a laser weld process to form the joints 610 of FIG. 6B when assembling the TO-CAN structure 500, a fabricator can initially apply various offsets between the components so that the finished structure is aligned to form the beam path 550 between the optical device 210 and an optical fiber 570. To avoid laser hammering when joining components together a fabricator may, due to the asymmetric nature of the TO-CAN structure 500, may apply offsets between various components during assembly.

A fabricator can use a receptacle-holder offset 710 to position the receptacle 510, z-sleeve 520 and the lens holder 300 out of initial alignment with one another on or more axes so that the receptacle 510, z-sleeve 520 and lens holder 300 come into alignment (e.g., are concentric and flush with one another) after a laser welding process.

Similarly, a fabricator can use a holder-header offset 720 to position the lens holder 300 and the header structure 100 out of initial alignment with one another on or more axes so that the header structure 100 and lens holder 300 come into alignment (e.g., are flush with one another) after a laser welding process. Because the header structure 100 and the lens holder 300 are not joined around the entire perimeter of the lens holder 300 (e.g., due to the generally semi-circular or lunate shape of the bonding face 122), the holder-header offset 720 can include an angled offset. For example, when the bonding face 121 is disposed in a first plane, the holder-header offset 720 can position the lens holder 300 in a second plane that intersects the first plane at a known angle to counter the forces applies during laser welding to "pull" the bonding face 121 and lens holder 300 into a flush position where the optical device 210 is aligned with the lens 530 after laser welding is complete.

Figure 8:
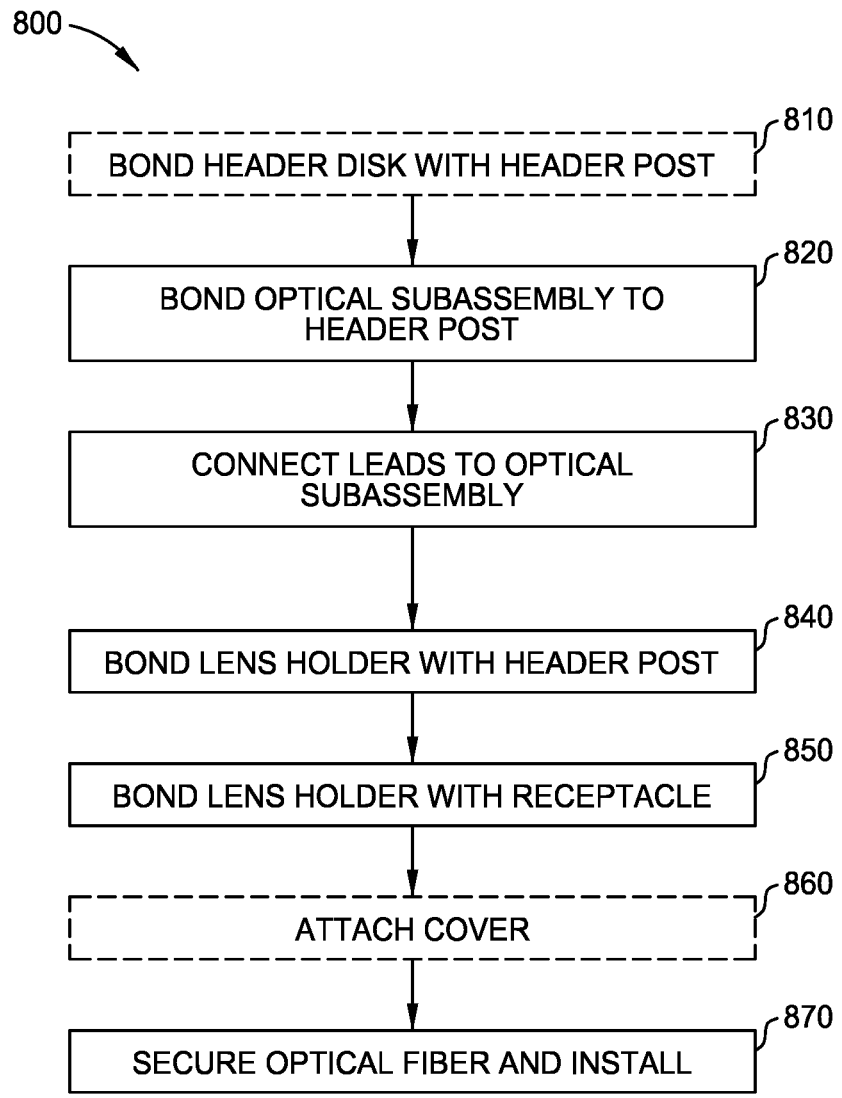
FIG. 8 is a flowchart of a method for assembly of a TO-CAN structure, according to embodiments of the present disclosure.

FIG. 8 is a flowchart of a method 800 for assembly of a TO-CAN structure 500, according to embodiments of the present disclosure. When using a single-piece header structure 100, in which the header disk 110 and header post 120 are fabricated as one piece, method 800 begins at block 820. Otherwise when using a two-piece header structure 100, method 800 begins a block 810, where a fabricator bonds the header disk 110 with the header post 120.

At block 810 the fabricator bonds the internal face 112 of the header disk 110 with the connecting face 124 of the header post 120, for example, via laser welding, brazing, welding, soldering, or an adhesive. When assembled, the arc 230 described by the arced face 123 of the header post 120 is aligned with the circumference 111 of the header disk 110. Stated differently, the arc 230 and the circumference 111 share a radius sot that when aligned, the arced face 123 and the radial face 113 are coterminous in the portion of the circumference 111 described by the arc 230. In various embodiments, the fabricator position the internal face 112 at an offset angle relative to the connecting face 124 at a time of bonding to account for laser hammering, so that the two surfaces are aligned after bonding.

At block 820, the fabricator bonds an optical subassembly 200 to a mounting face 121 of the header post 120. In various embodiments, a solder or wire mount captures a sub-mount 220 on a planar surface of the mounting face 121 or in a cavity defined in the mounting face 121. The size and position of the sub-mount 220 on the mounting face 121 (and any cavities defined therein or platforms defined thereon) position the optical device 210 of the optical subassembly 200 at a predefined location to generate or receive optical signals via a beam path 550 through a lens 530.

At block 830, the fabricator connects the leads 130 to the optical subassembly 200. The leads 130 provide electrical pathways to external electrical elements that offer input electrical signals and power to the optical subassembly 200, and optionally provide output electrical signal paths from the optical subassembly 200. In various embodiments, the leads 130 are connected to input or output ports of the optical subassembly via wire bonds or solder bonds.

At block 840, the fabricator bonds the lens holder 300 with the header post 120 (e.g., via laser welding). In various embodiments, one or more joints 610 are formed between the header post 120 and the lens holder 300 (e.g., via laser welding), and the fabricator can position the bonding face 122 at an offset angle (e.g., a holder-header offset 720) relative to the lens holder 300 to account for laser hammering so that the two surfaces are aligned after bonding.

At block 850, the fabricator bonds the lens holder 300 with the receptacle 510. In various embodiments, one or more joints 610 are formed between the receptacle 510 and the lens holder 300 (e.g., via laser welding), and the fabricator can position the components with an offset between each other (e.g., a receptacle-holder offset 710) to account for laser hammering so that the two components are aligned after bonding. The lens 530 included in the lens holder 300 is aligned with the optical device 210 mounted to the mounting face 121 (per block 820) to define a beam path 550 between the lens 530 and the optical device 210, and eventually an optical fiber 570 (e.g., included per block 870).

At block 860, a fabricator optionally attaches a cover 540 to the TO-CAN structure 500. In various embodiments, the cover 540 is bonded to one or more of the internal face 112 of the header disk 110, the radial face 113 of the header disk 110, the outer surface 301 of the lens holder 300, and the arced face 123 of the header post 120. The cover 540 can form a hermetic seal around the optical subassembly 200 in a cavity within the TO-CAN structure 500, or the cover 540 can form a non-hermetic seal or a partial seal around the optical subassembly 200.

In various embodiments, the various faces of the header post 120 can be pre-treated to aid in bonding with one or more of the header disk 110, the lens holder 300, and the cover 540. A seed metal applied to the bonding face 122, the arced face 123, or the connecting face 124 can aid in brazing, welding, or the application of an adhesive, depending on the bonding method used to secure one or more of the header disk 110 (per block 810), the lens holder 300 (per block 840), or the cover 540 with the header post 120 (per block 860).

At block 870, the fabricator secures an optical fiber 570 in the receptacle 510 (e.g., via an epoxy or other adhesive) and installs the TO-CAN structure 500 into an optical assembly. In various embodiments, the fabricator connects various external electrical wires to the leads 130 and positions the arced face 123 of the header post 120 in contact with an external heat sink. The external heatsink can be in contact via a thermal paste with the arced face 123, and the TO-CAN structure 500 is held in contact with the heatsink via an external case, one or more alignment features, or screw mounts.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. A device, comprising:
   a header disk having a radial face and an internal face with a circumference;
   a header post that is thermally conductive, the header post having:
      a connecting face contacting the internal face and connected coterminously with the circumference;
      a bonding face opposite to the connecting face;
      an arced face sharing a radius with the radial face of the header disk and at least partially orbiting the bonding face;
      a mounting face perpendicular to the connecting and the bonding face;
   a lens holder, wherein the lens holder is an annular cylinder that has a first end surface, a second end surface opposite the first end surface, an inner surface, and an outer surface, wherein the inner and outer surfaces extend between and connect the first and second end surfaces, and the inner surface defines an interior of the lens holder in which a lens is received, and wherein at least a portion of the first end surface is bonded to the bonding face of the header post and the outer surface is radially offset from the arced face of the header post; and
   an optical subassembly connected to the mounting face and optically aligned with the lens of the lens holder.

2. The device of claim 1, further comprising:
   a cover connected to the internal face of the header disk, the outer surface of the lens holder, and the arced face of the header post.

3. The device of claim 2, wherein the cover hermetically seals the optical subassembly.

4. The device of claim 2, wherein the arced face of the header post is treated with a seed metal for bonding the cover thereto.

5. The device of claim 1, wherein the internal face is circular in cross-section in a first plane and the connecting face and the bonding face are semi-circular in cross-section in the first plane.

6. The device of claim 1, wherein the mounting face includes an elevated portion level with a laser sub-mount of the optical subassembly.

7. The device of claim 1, further comprising:
   a heatsink connected to the arced face of the header post.

8. A device, comprising:
   a header disk having a circumference; and
   a header post that is thermally conductive, the header post having:
      an arc coterminous to a portion of the circumference;
      a mounting face, perpendicular to a plane in which the arc and the circumference are defined; and
      a bonding face perpendicular to the mounting face;
   a lens holder bonded to the bonding face and including a lens;
   a sleeve bonded to the lens holder and arranged to receive an optical isolator; and
   a fiber receptacle coupled with the lens holder by way of the sleeve, the fiber receptacle and the sleeve holding an optical fiber in optical alignment with the optical isolator and the lens.

9. The device of claim 8, further comprising:
   a laser sub-mount connected to the mounting face and including a laser; and
   an optical fiber receptacle connected to the lens holder and including an optical fiber optically aligned with the laser via the lens.

10. The device of claim 8, wherein the lens holder is an annular cylinder that is concentrically aligned with the header disk and has an outer diameter that is shorter than a diameter of the header disk.

11. A method for constructing a transmitter optical subassembly (TOSA), comprising:
   bonding an internal face of a header disk to a connecting face of a header post that is thermally conductive, wherein an arc described by a arced face of the header post is aligned with a circumference described by a radial face of the header disk;
   bonding a first end surface of a lens holder to a bonding face of the header post, opposite to the connecting face; and
   bonding a laser sub-mount to a mounting face of the header post, perpendicular to the connecting face and the bonding face, and
   wherein at least one:
      the internal face is positioned at an offset angle to the connecting face at time of bonding to account for hammering during bonding; or
      the first end surface is positioned at an offset angle to the bonding face at time of bonding to account for hammering during bonding.

12. The method of claim 11, further comprising:
   bonding a cover to the internal face of the header disk, the arced face of the header post, and the lens holder.

13. The method of claim 12, wherein the cover hermetically seals the laser sub-mount.

14. The method of claim 11, wherein bonding is performed via laser welding.

15. The method of claim 11, wherein the arc and the circumference share a radius, and the arc describes up to 180 degrees.

16. The method of claim 11, wherein bonding the laser sub-mount optically aligns a laser included in the laser sub-mount with a lens included in the lens holder.

17. The method of claim 16, wherein the mounting face of the header post includes a mounting cavity in which the laser sub-mount is bonded.

18. The method of claim 11, wherein bonding the first end surface of the lens holder to the bonding face of the header post includes two joints bonding the lens holder with the header post.

19. The method of claim 11, wherein the first end surface is positioned at the offset angle to the bonding face at time of bonding to account for hammering during bonding.

20. The method of claim 11, wherein the internal face is positioned at the offset angle to the connecting face at time of bonding to account for hammering during bonding.

* * * * *